United States Patent
Lin et al.

(10) Patent No.: US 12,123,105 B2
(45) Date of Patent: *Oct. 22, 2024

(54) CRYSTAL GROWTH METHOD AND WAFER

(71) Applicant: GlobalWafers Co., Ltd., Hsinchu (TW)

(72) Inventors: Ching-Shan Lin, Hsinchu (TW);
Ye-Jun Wang, Hsinchu (TW);
Chien-Cheng Liou, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,867

(22) Filed: Jun. 30, 2023

(65) Prior Publication Data
US 2024/0011186 A1 Jan. 11, 2024

Related U.S. Application Data

(60) Provisional application No. 63/359,209, filed on Jul. 8, 2022.

(51) Int. Cl.
*C30B 29/36* (2006.01)
*C30B 23/00* (2006.01)

(52) U.S. Cl.
CPC ............ *C30B 23/002* (2013.01); *C30B 29/36* (2013.01)

(58) Field of Classification Search
CPC .................................................... C30B 23/002
See application file for complete search history.

(56) References Cited

U.S. PATENT DOCUMENTS 10,106,913 B2 * 10/2018 Bondokov .............. C30B 23/06

FOREIGN PATENT DOCUMENTS

| CN | 107142520 | 9/2017 |
|---|---|---|
| CN | 108130594 | 6/2018 |
| CN | 106716596 | 11/2020 |
| CN | 110055583 | 1/2021 |
| CN | 110904508 | 1/2021 |
| JP | H09194296 | 7/1997 |
| JP | 2015229623 | 12/2015 |

OTHER PUBLICATIONS

"Office Action of Taiwan Counterpart Application", issued on Feb. 22, 2024, p. 1-p. 7.
"Office Action of Taiwan Related Application, Application No. 112124541", issued on Feb. 22, 2024, p. 1-p. 5.
"Office Action of Japan Counterpart Application", issued on Jul. 23, 2024, p. 1-p. 5.

* cited by examiner

*Primary Examiner* — Elizabeth E Mulvaney
(74) *Attorney, Agent, or Firm* — JCIPRNET

(57) ABSTRACT

A crystal growth method, including providing a seed crystal in a crystal growth furnace, and forming a crystal on the seed crystal along a first direction after multiple time points, is provided. The crystal includes multiple sub-crystals stacked along the first direction, a corresponding one of the sub-crystals is formed at each of the time points, and the sub-crystals include multiple end surfaces away from the seed crystal, so that a difference value of maximum temperatures of any two of the end surfaces is less than or equal to 20 degrees. A wafer is also provided.

19 Claims, 6 Drawing Sheets

CRYSTAL GROWTH METHOD AND WAFER

CROSS-REFERENCE TO RELATED APPLICATION

This application claims the priority benefit of U.S. provisional application Ser. No. 63/359,209, filed on Jul. 8, 2022. The entirety of the above-mentioned patent application is hereby incorporated by reference herein and made a part of this specification.

BACKGROUND

Technical Field

The disclosure relates to a crystal growth method and a wafer, and in particular to a crystal growth method capable of forming a thicker, larger-sized, and preferable-quality crystal and a preferable-quality wafer.

Description of Related Art

During the forming process of the crystal in the conventional crystal growth method, the temperature of the crystal in the thermal field of the crystal growth furnace may easily be different due to the position of the crystal. For example, the temperature difference between the uppermost and lowermost end surfaces of the crystal may be as high as about 100 degrees. There is the issue of uneven temperature between the two end surfaces of the crystal, which causes a large stress difference between the two end surfaces of the crystal, thereby affecting the thickness, the size, and the quality of the crystal.

The ingot obtained after processing the crystal formed by the conventional crystal growth method has a thin thickness, is difficult to manufacture in a large size, and has poor quality. The wafer obtained after processing such as cutting, grinding, and polishing the ingot also has poor quality.

SUMMARY

The disclosure provides a crystal growth method, which can reduce the stress difference between end surfaces of a crystal, thereby increasing the thickness and the size and improving the quality of the crystal.

The disclosure provides a wafer, which has preferable quality.

The crystal growth method of the disclosure includes providing a seed crystal in a crystal growth furnace, and forming a crystal on the seed crystal along a first direction after multiple time points. The crystal includes multiple sub-crystals stacked along the first direction, a corresponding one of the sub-crystals is formed at each of the time points, the sub-crystals include multiple end surfaces away from the seed crystal, so that a difference value of maximum temperatures of any two of the end surfaces is less than or equal to 20 degrees.

In an embodiment of the disclosure, the difference value of the maximum temperatures of any two of the end surfaces is less than or equal to 15 degrees.

In an embodiment of the disclosure, the difference value of the maximum temperatures of at least two of the end surfaces is less than or equal to 10 degrees.

In an embodiment of the disclosure, the difference value of the maximum temperatures of at least two of the end surfaces is less than or equal to 5 degrees.

In an embodiment of the disclosure, the difference value of the maximum temperatures of at least two of the end surfaces is less than or equal to 2 degrees.

In an embodiment of the disclosure, each of the end surfaces includes a center and an edge, and a difference value of temperatures of the center and the edge is less than or equal to 20 degrees.

A wafer of the disclosure includes a wafer body, a diameter of the wafer body is greater than or equal to 150 mm, a basal plane dislocation of the wafer body is less than or equal to 1000 ea/cm$^2$, and a bar stacking fault of the wafer body is less than or equal to 100 ea/wf.

In an embodiment of the disclosure, the basal plane dislocation of the wafer body is less than or equal to 500 ea/cm$^2$, 300 ea/cm$^2$, or 200 ea/cm$^2$.

In an embodiment of the disclosure, the bar stacking fault of the wafer body is less than or equal to 50 ea/wf, 30 ea/wf, or 10 ea/wf.

In an embodiment of the disclosure, a bow of the wafer body is between plus or minus 15 μm, plus or minus 30 μm, or plus or minus 50 μm.

In an embodiment of the disclosure, a warp of the wafer body is less than or equal to 50 μm, less than or equal to 30 μm, or less than or equal to 10 μm.

Based on the above, in the crystal growth method of the disclosure, the seed crystal is placed in the crystal growth furnace, and the corresponding sub-crystal is obtained at each time point after the time points. The difference value of the maximum temperatures of the end surfaces of any two of the sub-crystals is less than or equal to 20 degrees. Such a design can form a crystal with a thicker thickness, a larger size, and preferable quality. In addition, the wafer of the disclosure has preferable quality.

DESCRIPTION OF THE EMBODIMENTS

Figure 1:
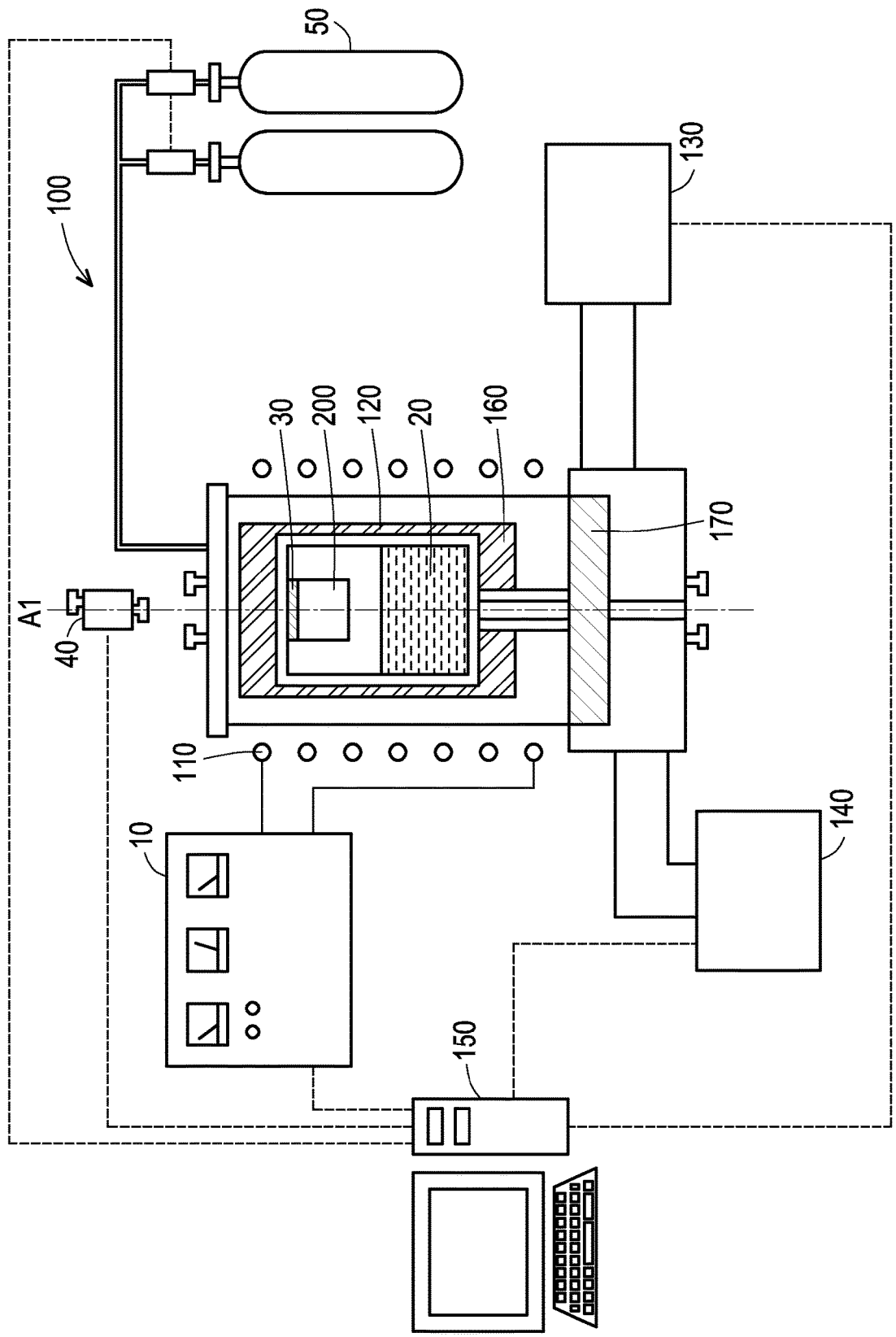
FIG. 1 is a schematic diagram of a crystal growth furnace system according to an embodiment of the disclosure.

FIG. 1 is a schematic diagram of a crystal growth furnace system according to an embodiment of the disclosure. Please refer to FIG. 1. A crystal growth furnace system 100 includes an external heating module 110, a furnace 120, a first driven device 130, a second driven device 140, and a control device 150. The external heating module 110 is electrically connected to a power supply 10. The furnace 120 is movably disposed in the external heating module 110 and is connected to a gas cylinder 50 with a gas pipe. The first driven device 130 drives the furnace 120 to move along an axis A1. The second driven device 140 drives the furnace 120 to rotate around the axis A1. The control device 150 is electrically connected to the first driven device 130, the second driven device 140, the external heating module 110, the power supply 10, and a thermometer 40.

The control device 150 controls the first driven device 130 and the second driven device 140 to simultaneously or not simultaneously operate, so that the furnace 120 moves or/and rotates in the external heating module 110. For example, the furnace 120 may first move up and down, then rotate at the same height, and finally simultaneously rotate during the process of moving up and down.

Therefore, compared with an external heating module of a conventional movable type crystal growth furnace, which can only move up and down relative to a furnace, the furnace 120 of the crystal growth furnace system 100 may not only move up and down relative to the external heating module 110, but also rotate relative to the external heating module 110, and the crystal growth furnace system 100 may control the movement and the rotation to simultaneously or not simultaneously operate. Such a design can enable the furnace 120 be more evenly heated, so that the crystal 200 can be more evenly heated, so as to obtain the thicker crystal 200 with improved quality.

In addition, the external heating module 110 is a heating coil group, and the heating coil group covers a moving range of the furnace 120 moving along the axis A1.

On the other hand, the first driven device 130 drives the furnace 120 to move along the axis A1 with a maximum moving distance of less than or equal to 200 mm, a minimum movable distance of greater than or equal to 0.1 μm, and a moving speed of between 0.05 mm/hour and 100 mm/minute. In addition, the second driven device 140 drives the furnace 120 to rotate around the axis A1 with a maximum rotating speed of less than 20 rpm and a minimum adjustable rotating speed of greater than or equal to 0.01 rpm.

As shown in FIG. 1, the crystal growth furnace system 100 further includes a heat insulating layer 160 covering the furnace 120 and linked to the furnace 120 to maintain the temperature of the furnace 120, so as to prevent the temperature difference of the furnace 120 from being too large. On the other hand, the crystal growth furnace system 100 further includes a weighing scale 170 located below the furnace 120 to weigh the total weight of the furnace 120, the heat insulating layer 160, the crystal 200, and a silicon carbide raw material 20. Such a design can detect the weight loss of the vaporized silicon carbide raw material 20 being pumped. The maximum load that the weighing scale 170 may withstand is greater than or equal to 3 kg, such as 5 kg or 10 kg, and the minimum weight loss rate resolvable by the weighing scale 170 is greater than or equal to 0.1 g/hour.

Please refer to FIG. 1 again. When using the crystal growth furnace system 100 to implement a crystal growth method for forming the crystal 200, the furnace 120 of the crystal growth furnace system 100 is filled with the silicon carbide raw material 20 and a seed crystal 30 is provided on an inner top wall of the furnace 120. After a certain period of time, the crystal 200 may be formed below the seed crystal 30.

Figure 2:
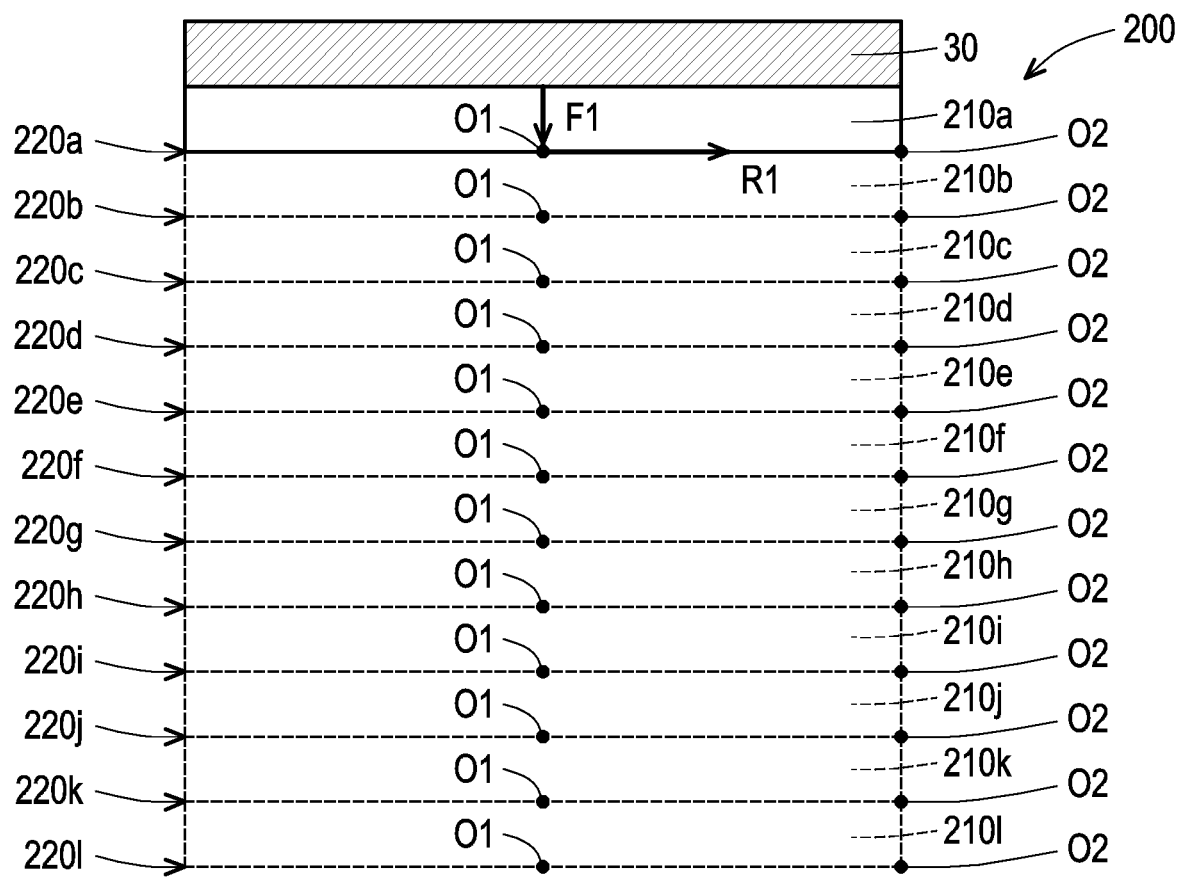
FIG. 2 is a schematic diagram of a crystal formed according to an embodiment of the disclosure.

FIG. 2 is a schematic diagram of a crystal formed according to an embodiment of the disclosure. Please refer to FIG. 2. The seed crystal 30 forms the crystal 200 along a first direction F1 after multiple time points. The crystal 200 includes multiple sub-crystals 210a to 210l stacked along the first direction F1. The corresponding sub-crystal 210a to 210l is formed at each of the time points. In the embodiment, the number of the sub-crystals 210a to 210l is 12, and the interval between the time points is 10 hours, but the number and the interval are not limited thereto. The number of sub-crystals may be 20, and the time interval may be 10 hours. In other embodiments, the number of sub-crystals may be 10, and the time interval may be 5 hours, which may be adjusted according to the manufacturing design, and the disclosure is not limited thereto. The sub-crystals 210a to 210l include multiple end surfaces 220a to 220l away from the seed crystal 30. Specifically, the end surfaces 220a to 220l are interfaces between solid, that is, the crystal 200 and gas during a sublimation process. A center O1 of each of the end surfaces 220a to 220l is respectively located at an intersection of the first direction F1 corresponding to the end surfaces 220a to 220l. It should be noted that FIG. 2 is only one of the embodiments. In other embodiments, the sizes of the sub-crystals 210a to 210l from the centers O1 to maximum crystal radial positions O2 may be the same or different, and the disclosure is not limited thereto.

Figure 3:
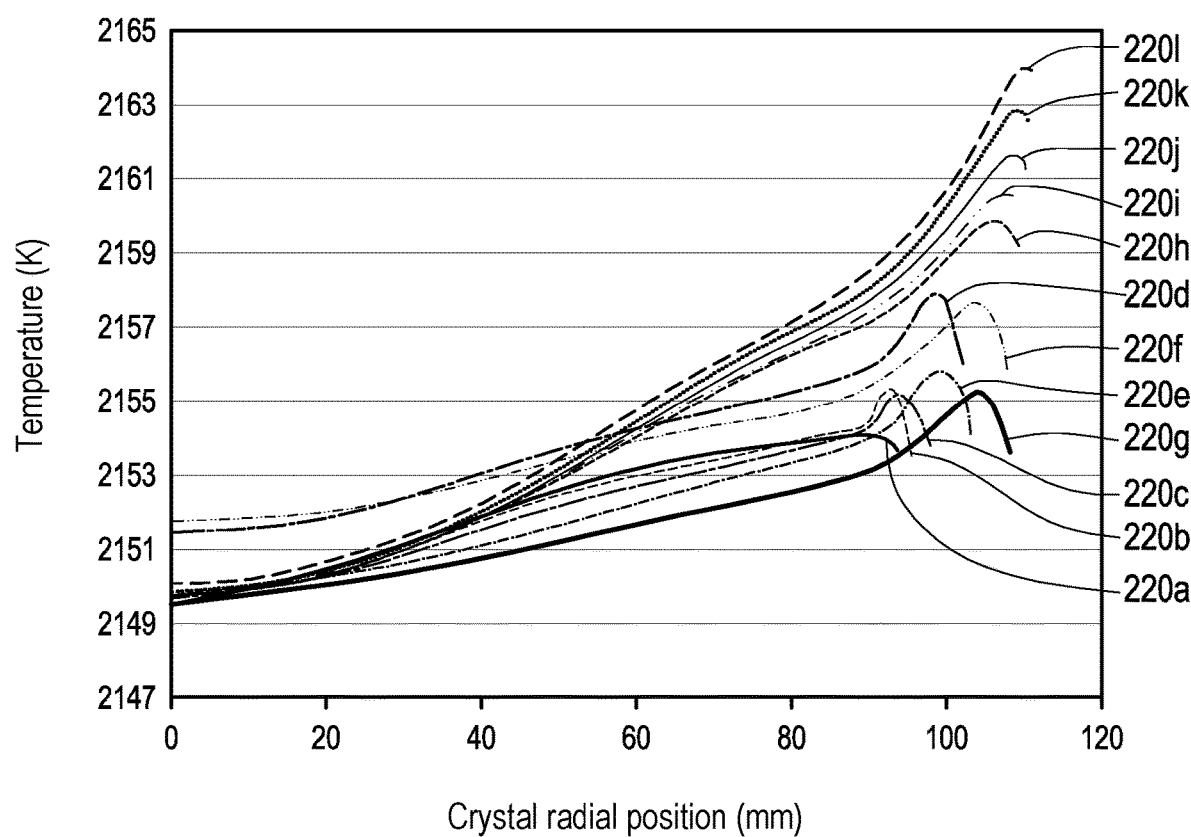
FIG. 3 is a schematic diagram of a relationship between a temperature of an end surface and a crystal radial position of the crystal of FIG. 2 at multiple time points.

FIG. 3 is a schematic diagram of a relationship between a temperature of an end surface and a crystal radial position of the crystal 200 of FIG. 2 at multiple time points. As shown in FIG. 3, each line represents the sub-crystals 210a to 210l stacked along the first direction F1 and the temperature measured on each of the end surfaces 220a to 220l of the sub-crystals 210a to 210l, wherein the crystal radial position 0 mm on the horizontal axis represents the center O1 of each of the end surfaces 220a to 220l, and the remaining crystal radial positions are distances from the centers O1 of the end surfaces 220a to 220l along a radial direction R1 relative to the centers O1. It is worth noting that the process of the seed crystal 30 forming the crystal 200 after the time points may include growing along the first direction F1 and along the radial direction R1, and the disclosure is not limited thereto.

In the temperature curves of the end surfaces 220a to 220l, when comparing own temperature differences of the end surfaces 220a to 220l, that is, from the centers O1 to the maximum crystal radial positions O2 of the end surfaces 220a to 220l, the end surface 220a has the smallest temperature difference, and the temperature difference is about 3 to 5 degrees. The end surface 220l has the largest temperature difference, and the temperature difference is about 10 to 15 degrees. On the other hand, when comparing the temperature differences of the end surfaces 220a to 220l at the same crystal radial positions, the centers O1 of the end surfaces 220a to 220l has smaller temperature differences, and the temperature differences are about 0 to 3 degrees. The maximum crystal radial positions O2 of the end surfaces 220a to 220l has larger temperature differences, and the temperature differences are about 10 to 20 degrees. In other words, among the end surfaces 220a to 220l, regardless of whether at the same radii or at different radii, the difference value between the temperatures of any two is about 20 degrees or less, such as 15 degrees, 10 degrees, 5 degrees, or 2 degrees. In other words, regardless of to which of the sub-crystals 210a to 210l the crystal 200 is stacked along the first direction F1, when measuring any position at any time, and the difference value between the temperatures of any two is about 20 degrees or less. During the growth process of the crystal 200 of the embodiment, the high-quality, large-size, and large-thickness crystal 200 and wafer 400 (FIG. 6) with low stress are grown by reducing the temperature gradient variation of a thermal field.

Figure 4A:
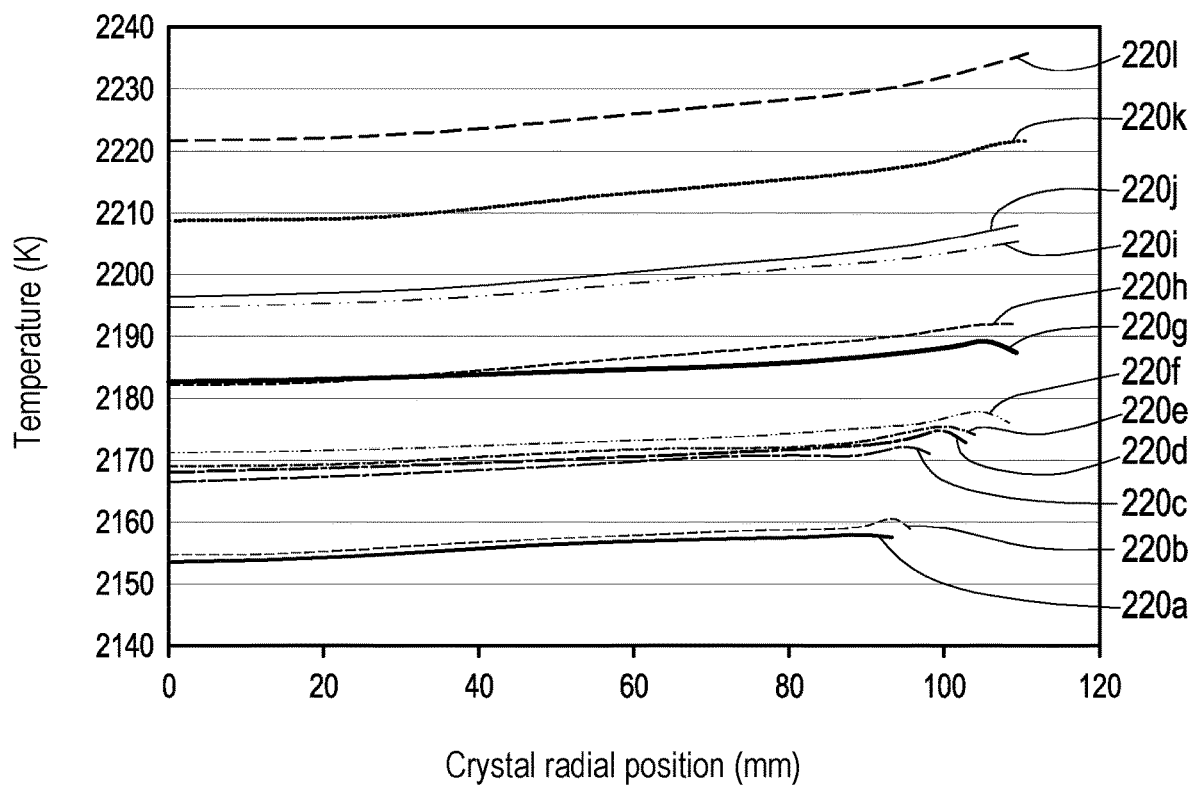
FIG. 4A is a schematic diagram of a relationship between a temperature of an end surface and a crystal radial position of a crystal formed in a conventional fixed type crystal growth furnace at multiple time points.

FIG. 4A is a schematic diagram of a relationship between a temperature of an end surface and a crystal radial position of a crystal formed in a conventional fixed type crystal growth furnace at multiple time points. Please refer to FIG.

4A. In the temperature curves of the end surfaces 220a to 220l, when comparing the own temperature differences of the end surfaces 220a to 220l, the end surface 220a has the smallest temperature difference, and the temperature difference is about 5 degrees. The end surface 220l has the largest temperature difference, and the temperature difference is about 15 degrees. On the other hand, when comparing the temperature differences of the end surfaces 220a to 220l at the same crystal radial positions, the temperature differences of the centers of the end surfaces 220a to 220l are at most about 70 degrees, and the maximum temperature difference of the maximum crystal radial positions O2 of the end surfaces 220a to 220l is about 80 degrees.

Figure 4B:
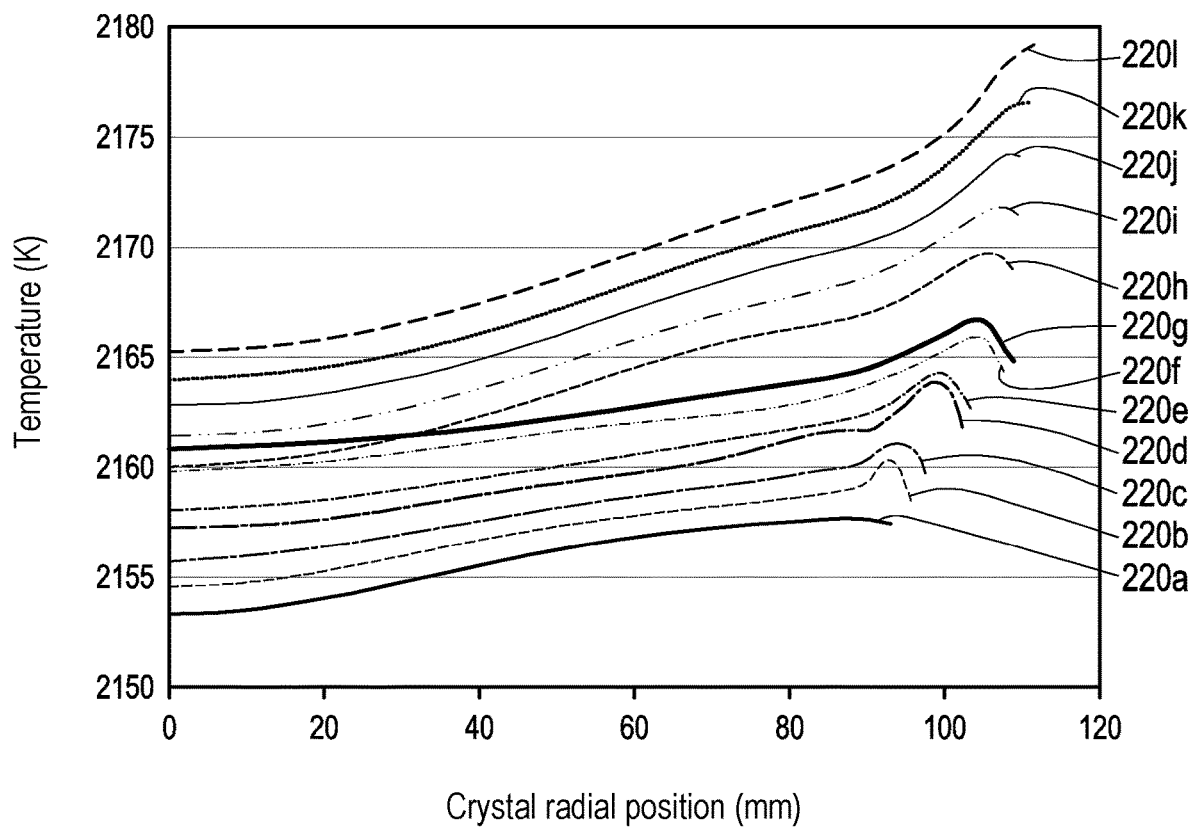
FIG. 4B is a schematic diagram of a relationship between a temperature of an end surface and a crystal radial position of a crystal formed in a conventional movable type crystal growth furnace at multiple time points.

FIG. 4B is a schematic diagram of a relationship between a temperature of an end surface and a crystal radial position of a crystal formed in a conventional movable type crystal growth furnace at multiple time points. Please refer to FIG. 4B. In the temperature curves of the end surfaces 220a to 220l, when comparing the own temperature differences of the end surfaces 220a to 220l, the end surface 220a has the smallest temperature difference, and the temperature difference is about 5 degrees. The end surface 220l has the largest temperature difference, and the temperature difference is about 15 degrees. On the other hand, when comparing the temperature differences of the end surfaces 220a to 220l at the same crystal radial positions, the temperature differences of the centers of the end surfaces 220a to 220l are at most about 12 degrees, and the maximum temperature difference of the maximum crystal radial positions O2 of the end surfaces 220a to 220l is about greater than 20 degrees.

From the results of FIG. 3, FIG. 4A, and FIG. 4B, it can be known that when the crystal growth method for forming the crystal 200 is implemented by the crystal growth furnace system 100, the own temperature differences of the end surfaces 220a to 220l and the temperature differences between the end surfaces 220a to 220l of the crystal 200 are significantly reduced. As a result, the stress difference between the crystals 200 is reduced, thereby increasing the thickness T1 and the size and improving the quality of the crystal 200.

It should be noted that the crystal 200 is not limited to being formed in the crystal growth furnace system 100. In other embodiments, as long as the maximum temperature difference between any two of the end surfaces of the crystal 200 can be controlled to be less than or equal to 20 degrees, the effects of thicker thickness and preferable quality can also be achieved.

Figure 5:
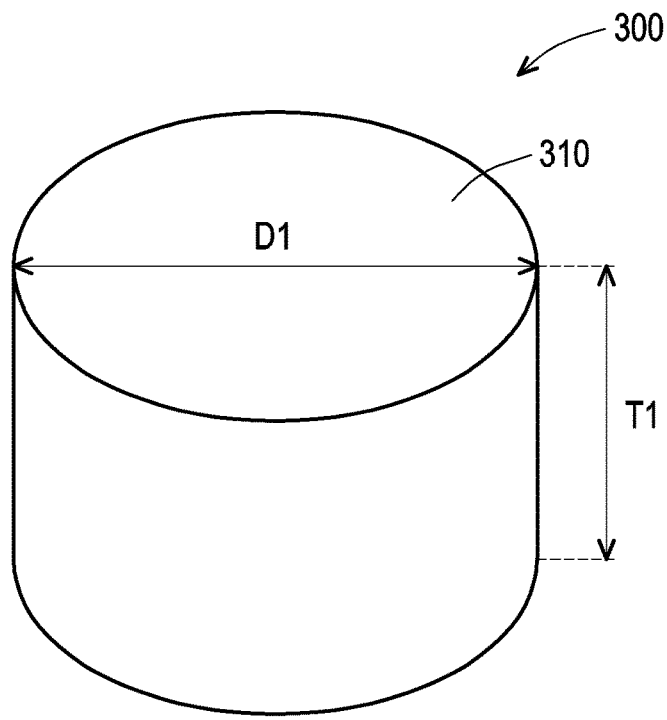
FIG. 5 is an ingot of the crystal of FIG. 2 after spheronization.

FIG. 5 is an ingot of the crystal of FIG. 2 after spheronization. An ingot 300 shown in FIG. 5 is a finished product of the crystal 200 formed by the crystal growth method and after spheronization, and the ingot 300 has the advantages of the preferable thickness and quality of the crystal 200. Therefore, a diameter D1 of an ingot body 310 of the ingot 300 is greater than or equal to 150 mm, and a thickness T1 is greater than or equal to 15 mm. For example, the diameter D1 is 150 mm, and the thickness T1 is greater than or equal to 25 mm, or the diameter D1 is 200 mm, and the thickness T1 is greater than or equal to 15 mm. The thickness T1 of the ingot body 310 is not limited thereto. In other embodiments, the thickness T1 of the ingot body 310 may also be as thick as 100 mm.

Figure 6:
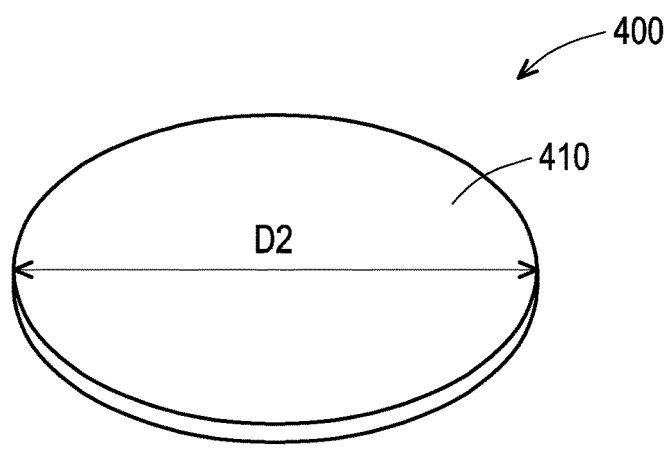
FIG. 6 is a wafer of the ingot of FIG. 5 after cutting, grinding, and polishing.

FIG. 6 is a wafer of the ingot of FIG. 5 after cutting, grinding, and polishing. A diameter D2 of the wafer 400 shown in FIG. 6 is close to the diameter D1 of the ingot 300 shown in FIG. 5. Therefore, the diameter D2 of a wafer body 410 of the wafer 400 is greater than or equal to 150 mm or greater than or equal to 200 mm.

In addition, the wafer 400 after cutting, grinding, and polishing also has the preferable quality of the ingot 300. Therefore, a basal plane dislocation (BPD) of the wafer body 410 is less than or equal to 1000 ea/cm$^2$, and a bar stacking fault of the wafer body 410 is less than or equal to 100 ea/wf. The BPD is, for example, less than or equal to 500 ea/cm$^2$, 300 ea/cm$^2$, or 200 ea/cm$^2$. The bar stacking fault is, for example, less than or equal to 50 ea/wf, 30 ea/wf, or 10 ea/wf.

On the other hand, a bow of the wafer body 410 is between plus or minus 15 μm, plus or minus 30 μm, or plus or minus 50 μm. A warp of the wafer body 410 is less than or equal to 50 μm, less than or equal to 30 μm, or less than or equal to 10 μm.

In summary, in the crystal growth method of the disclosure, by placing the seed crystal in the furnace of the crystal growth furnace system, the corresponding sub-crystal is formed at each of the time points. The sub-crystals are evenly heated, so that the maximum temperature difference between the end surfaces of any two of the sub-crystals may be less than or equal to 20 degrees. Such a design can reduce the stress difference of the crystal, thereby increasing the overall thickness and size and improving the quality of the crystal. After spheronization of the crystal formed by the crystal growth method of the disclosure, a thicker and preferable-quality ingot can be produced, and after cutting of the ingot, a preferable-quality wafer can be produced.

What is claimed is:

1. A crystal growth method, comprising:
providing a seed crystal in a crystal growth furnace, and forming a crystal on the seed crystal along a first direction after a plurality of time points, wherein the crystal comprises a plurality of sub-crystals stacked along the first direction, a corresponding one of the sub-crystals is formed at each of the time points, and the sub-crystals comprise a plurality of end surfaces away from the seed crystal, so that a difference value of maximum temperatures of any two of the end surfaces is less than or equal to 20 degrees.

2. The crystal growth method according to claim 1, wherein the difference value of the maximum temperatures of any two of the end surfaces is less than or equal to 15 degrees.

3. The crystal growth method according to claim 1, wherein the difference value of the maximum temperatures of at least two of the end surfaces is less than or equal to 10 degrees.

4. The crystal growth method according to claim 1, wherein the difference value of the maximum temperatures of at least two of the end surfaces is less than or equal to 5 degrees.

5. The crystal growth method according to claim 1, wherein the difference value of the maximum temperatures of at least two of the end surfaces is less than or equal to 2 degrees.

6. The crystal growth method according to claim 1, wherein each of the end surfaces comprises a center and an edge, and a difference value of temperatures of the center and the edge is less than or equal to 20 degrees.

7. A wafer, comprising:
a wafer body, wherein a diameter of the wafer body is greater than or equal to 150 mm, a basal plane dislocation of the wafer body is less than or equal to 1000 ea/cm$^2$, and a bar stacking fault of the wafer body is less than or equal to 100 ea/wf.

8. The wafer according to claim 7, wherein the basal plane dislocation of the wafer body is less than or equal to 500 ea/cm$^2$.

9. The wafer according to claim 7, wherein the bar stacking fault of the wafer body is less than or equal to 50 ea/wf.

10. The wafer according to claim 7, wherein a bow of the wafer body is between plus or minus 15 μm.

11. The wafer according to claim 7, wherein a warp of the wafer body is less than or equal to 50 μm.

12. The wafer according to claim 7, wherein the basal plane dislocation of the wafer body is less than or equal to 300 ea/cm$^2$.

13. The wafer according to claim 7, wherein the basal plane dislocation of the wafer body is less than or equal to 200 ea/cm$^2$.

14. The wafer according to claim 7, wherein the bar stacking fault of the wafer body is less than or equal to 30 ea/wf.

15. The wafer according to claim 7, wherein the bar stacking fault of the wafer body is less than or equal to 10 ea/wf.

16. The wafer according to claim 7, wherein a bow of the wafer body is between plus or minus 30 μm.

17. The wafer according to claim 7, wherein a bow of the wafer body is between plus or minus 50 μm.

18. The wafer according to claim 7, wherein a warp of the wafer body is less than or equal to 30 μm.

19. The wafer according to claim 7, wherein a warp of the wafer body is less than or equal to 10 μm.

\* \* \* \* \*